(12) United States Patent
Miyazaki

(10) Patent No.: US 7,999,577 B2
(45) Date of Patent: Aug. 16, 2011

(54) APPARATUS AND METHOD FOR DETECTING A CHANGING POINT OF MEASURED SIGNAL

(75) Inventor: Masashi Miyazaki, Gunma (JP)

(73) Assignee: Advantest Corporation, Tokyo (JP)

( * ) Notice: Subject to any disclaimer, the term of this patent is extended or adjusted under 35 U.S.C. 154(b) by 169 days.

(21) Appl. No.: 12/357,405

(22) Filed: Jan. 22, 2009

(65) Prior Publication Data

US 2010/0019801 A1  Jan. 28, 2010

(30) Foreign Application Priority Data

Jan. 25, 2008  (JP) ................. 2008-015394

(51) Int. Cl.
*G01R 25/00* (2006.01)
*H03D 13/00* (2006.01)
(52) U.S. Cl. .................. 327/7; 327/159; 375/371
(58) Field of Classification Search .............. 327/7, 159; 702/59; 375/359, 371
See application file for complete search history.

(56) References Cited

U.S. PATENT DOCUMENTS

| 6,041,089 | A  | * | 3/2000 | Yokomizo | 375/371 |
| 6,404,833 | B1 | * | 6/2002 | Takebe   | 375/371 |
| 6,614,863 | B1 | * | 9/2003 | Baba     | 375/359 |

FOREIGN PATENT DOCUMENTS

JP  06094853  4/1994

* cited by examiner

*Primary Examiner* — Lincoln Donovan
*Assistant Examiner* — John Poos
(74) *Attorney, Agent, or Firm* — Jianq Chyun IP Office

(57) ABSTRACT

Provided is an apparatus comprising a delaying section that generates a plurality of delayed signals by delaying a single first input signal by different delay amounts; a first acquiring section that acquires each of a plurality of input second input signals at a first phase of a reference clock; a second acquiring section that acquires each of the plurality of second input signals at a second phase of the reference clock, which is different from the first phase; and a change point detecting section that detects a change point of one of the first input signal and a second input signal, based on values of the plurality of signals acquired by the first acquiring section and values of the plurality of signals acquired by the second acquiring section.

13 Claims, 6 Drawing Sheets

APPARATUS AND METHOD FOR DETECTING A CHANGING POINT OF MEASURED SIGNAL

CROSS REFERENCE TO RELATED APPLICATION

The present application claims priority from a Japanese Patent Application No. 2008-015394 filed on Jan. 25, 2008, the contents of which are incorporated herein by reference.

BACKGROUND

1. Technical Field

The present invention relates to an apparatus, a method, and a test apparatus for detecting a change point of a signal under measurement.

2. Related Art

Japanese Patent Application Publication No. 6-94853 discloses a time measurement circuit that measures the timings of pulse edges. This time measurement circuit includes a counter that counts a clock, a latch that latches a value of the counter, a triangular wave generating circuit that generates a triangular wave in synchronization with the clock, an AD converter, and an adding device.

The latch acquires the counter value at the edges of the pulse under measurement. The AD converter samples the level of the triangular wave the edges of the pulse under measurement. The adding device outputs the edge timing of the pulse under measurement obtained by adding together the count value acquired by the latch and the output data of the AD converter. This time measurement circuit can accurately measure the edge timing of the pulse under measurement in less than one cycle of the clock.

However, since the high-speed and high-precision AD converter is expensive, the time measurement circuit using an AD converter as described above is also expensive. Many time measurement circuits are used in the field of test apparatuses, and therefore it is especially important to achieve a low-cost time measurement circuit with a simple configuration.

SUMMARY

Therefore, it is an object of an aspect of the innovations herein to provide an apparatus, a method, and a test apparatus for detecting a change point of a signal under measurement, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary apparatus may comprise a delaying section that generates a plurality of delayed signals by delaying a single first input signal by different delay amounts; a first acquiring section that acquires each of a plurality of input second input signals at a first phase of a reference clock; a second acquiring section that acquires each of the plurality of second input signals at a second phase of the reference clock, which is different from the first phase; and a change point detecting section that detects a change point of one of the first input signal and a second input signal, based on values of the plurality of signals acquired by the first acquiring section and values of the plurality of signals acquired by the second acquiring section.

According to a second aspect related to the innovations herein, one exemplary method may comprise generating a plurality of delayed signals by delaying a single first input signal by different delay amounts; acquiring each of a plurality of input second input signals at a first phase of a reference clock; acquiring each of the plurality of second input signals at a second phase of a reference clock, which is different from the first phase; and detecting a change point of one of the first input signal and a second input signal, based on values of the plurality of signals acquired at the first phase and values of the plurality of signals acquired at the second phase.

According to a third aspect related to the innovations herein, one exemplary test apparatus may include a test apparatus that tests a device under test, comprising a test signal supplying section that supplies the device under test with a test signal for testing the device under test; and a detection apparatus that measures a change timing of a response signal output by the device under test in response to the test signal The detection apparatus includes a delaying section that generates a plurality of delayed signals by delaying a single first input signal by different delay amounts; a first acquiring section that acquires each of a plurality of input second input signals at a first phase of a reference clock; a second acquiring section that acquires each of the plurality of second input signals at a second phase of a reference clock, which is different from the first phase; and a change point detecting section that detects a change point of one of the first input signal and a second input signal, based on values of the plurality of signals acquired by the first acquiring section and values of the plurality of signals acquired by the second acquiring section.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 1 shows an exemplary configuration of a test apparatus 10 according to an

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
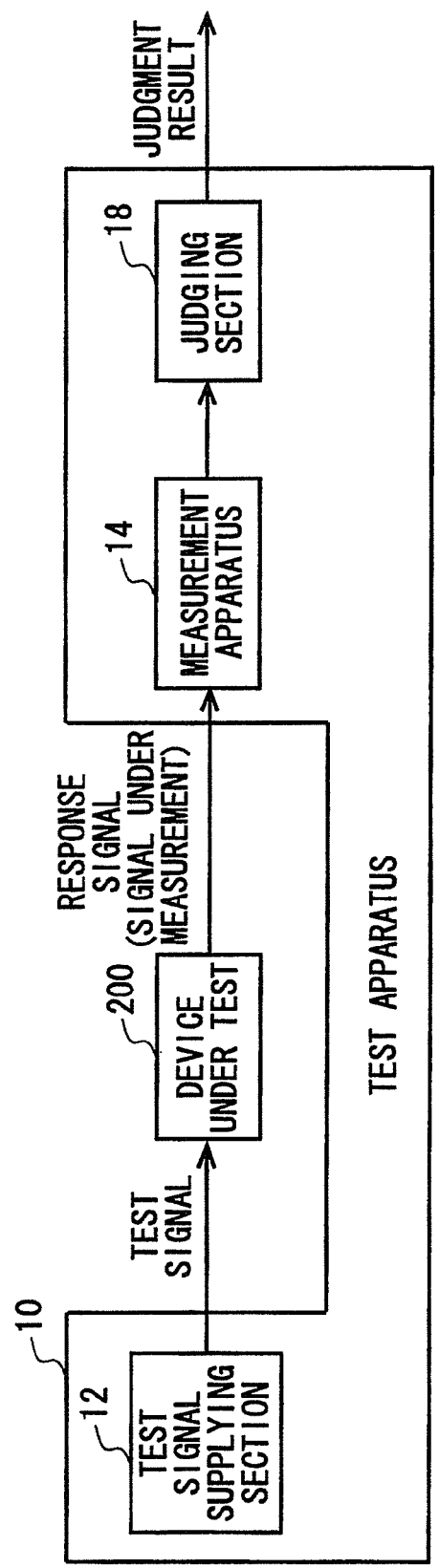

FIG. 1 shows an exemplary configuration of a test apparatus 10 according to an embodiment of the present invention, along with a device under test 200. The test apparatus 10 tests the device under test 200, which is a semiconductor device or the like.

The test apparatus 10 is provided with a test signal supplying section 12, a detection apparatus 14, and a judging section 18. The test signal supplying section 12 supplies the device under test 200 with a test signal to test the device under test 200.

The detection apparatus 14 receives a signal under measurement, which is a signal output by the device under test 200 in response to the test signal. The detection apparatus 14 measures the change timings of the signal under measurement. For example, the detection apparatus 14 measures the timings of the rising edges or the falling edges of the signal under measurement.

The judging section 18 receives the measurement result from the detection apparatus 14 and judges the acceptability of the device under test 200. The judging section 18 may output this judgment result to an external control apparatus or the like.

Figure 2:
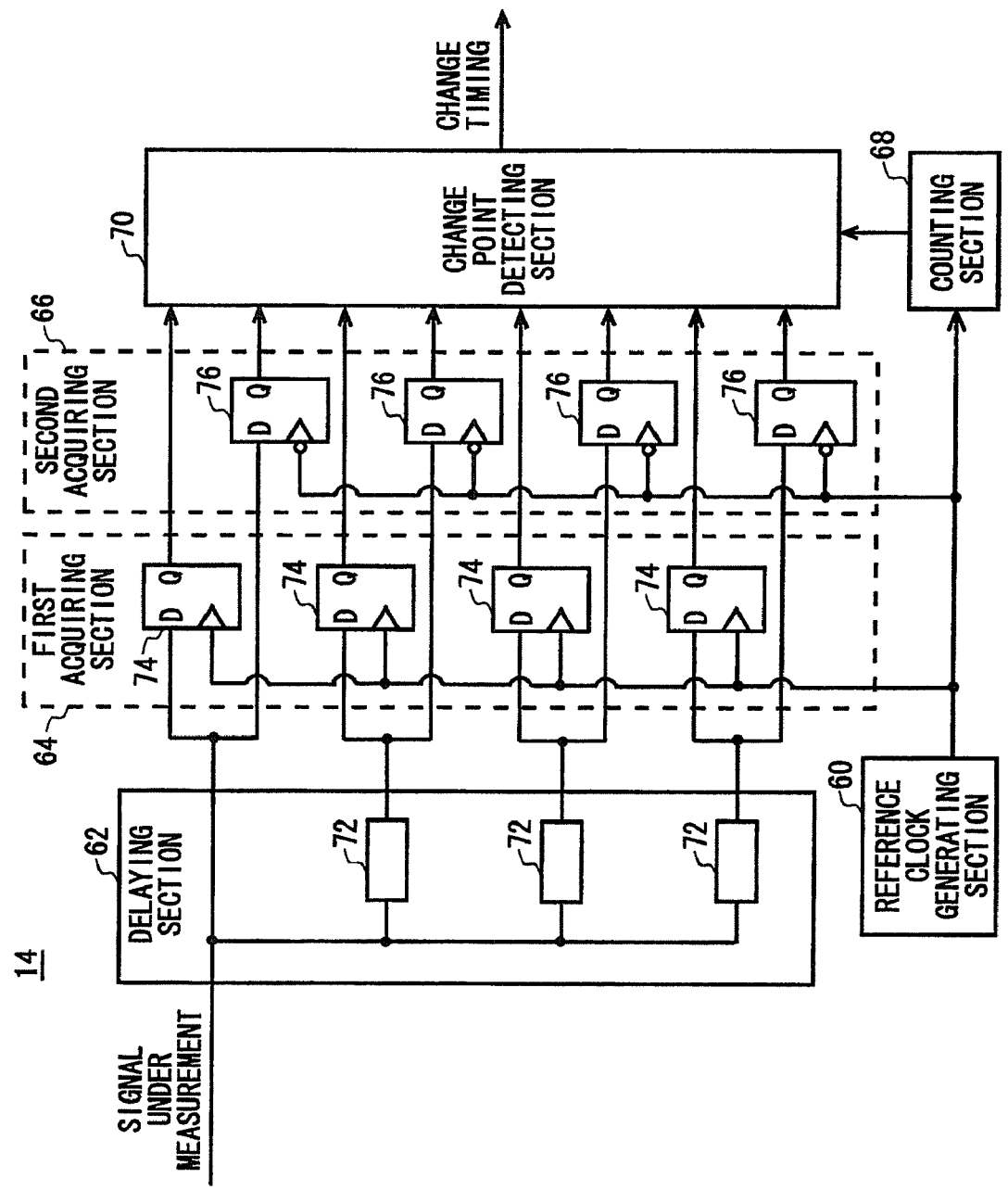
FIG. 2 shows an exemplary configuration of the detection apparatus 14 according to the present embodiment.

FIG. 2 shows an exemplary configuration of the detection apparatus 14 according to the present embodiment. The detection apparatus 14 includes a reference clock generating section 60, a delaying section 62, a first acquiring section 64, a second acquiring section 66, a counting section 68, and a change point detecting section 70.

The reference clock generating section 60 generates a reference clock. For example, the reference clock generating section 60 generates a reference clock with a duty ratio of 50%.

The delaying section 62 generates a plurality of delayed signals by applying different delay times to a signal under measurement supplied thereto. The delaying section 62 may include a plurality of delay elements 72, which are each set to have a different delay amount. Each delay element 72 outputs a delayed signal obtained by delaying the signal under measurement. In the present embodiment, the delaying section 62 generates four delayed signals.

The first acquiring section 64 acquires a value, e.g. a logic value, of each delayed signal at first phases of the reference clock. For example, the first acquiring section 64 acquires the value of each delayed signal at the rising edges of the reference clock.

In the present embodiment, the first acquiring section 64 includes a plurality of first latch sections 74 that correspond one-to-one with the plurality of delayed signals. Each first latch section 74 acquires the value of the corresponding delayed signal at the timings of the rising edges of the reference clock.

The second acquiring section 66 acquires a value, e.g. a logic value, of each delayed signal at second phases of the reference clock, which are different from the first phases. For example, the second acquiring section 66 acquires the value of each delayed signal at the falling edges of the reference clock.

In the present embodiment, the second acquiring section 66 includes a plurality of second latch sections 76 that correspond one-to-one with the plurality of delayed signals. Each second latch section 76 acquires the value of the corresponding delayed signal at the timings of the falling edges of the reference clock.

The counting section 68 counts the number of clocks of the reference clock generated by the reference clock generating section 60. For example, the counting section 68 resets the count at a reference time and then counts the number of clocks of the reference clock from the reference time.

The change point detecting section 70 detects the timings of the change points of the signal under measurement based on the value of each of the plurality of delayed signals acquired by the first acquiring section 64 and the second acquiring section 66. For example, the change point detecting section 70 identifies the timings of the change points of the signal under measurement as being the timings of the rising edges or the falling edges of the signal under measurement. The manner in which the change point detecting section 70 detects the timings of the change points of the signal under measurement is described in detail in relation to FIG. 3.

Figure 3:
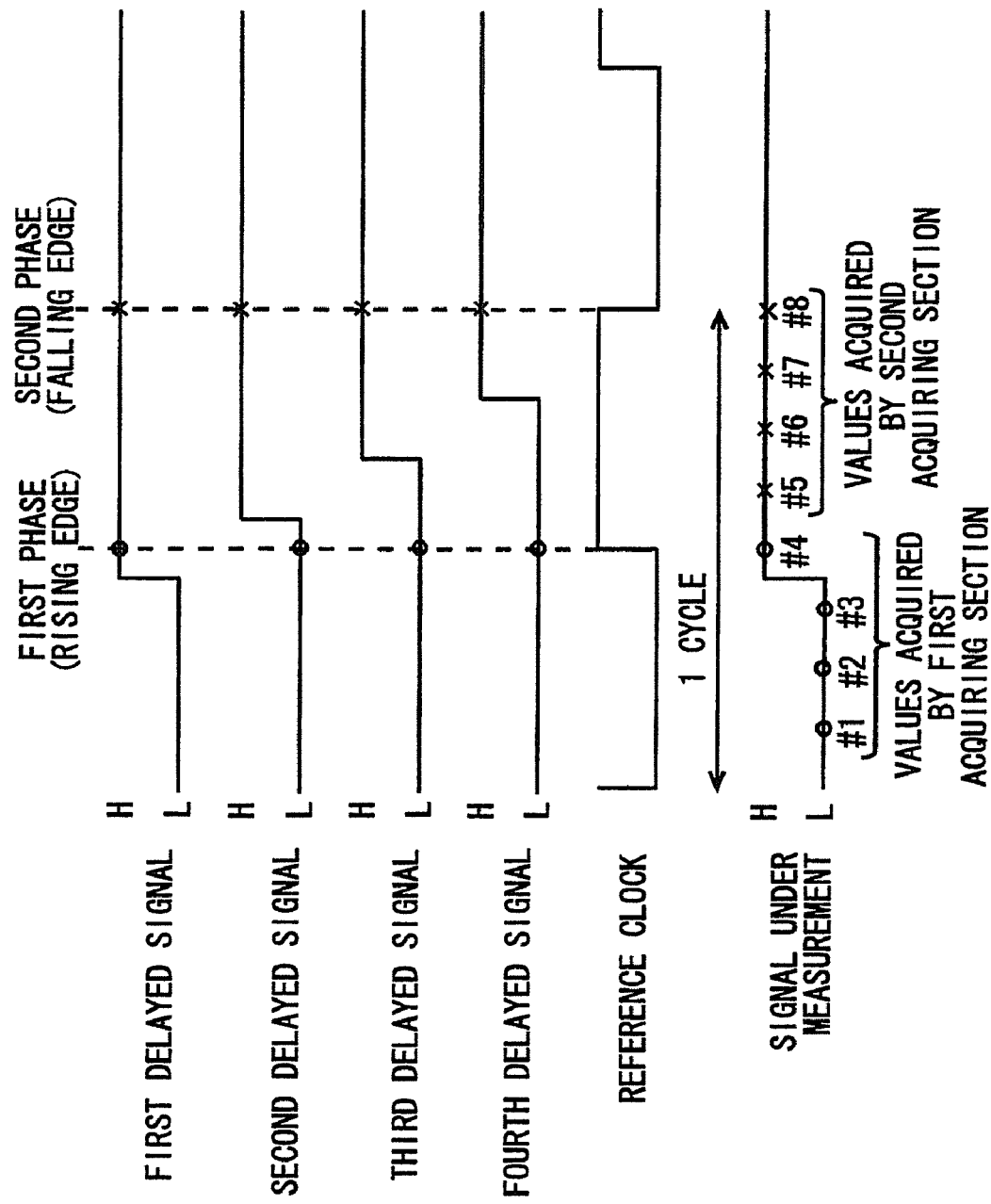
FIG. 3 shows examples of the four delayed signals, the reference clock, and the signal under measurement according to the present embodiment.

FIG. 3 shows examples of the four delayed signals, the reference clock, and the signal under measurement according to the present embodiment. The delaying section 62 delays the delayed signals such that the timing at which each value is acquired is within one cycle of the reference clock when the values of the plurality of delayed signals acquired by the first acquiring section 64 and the second acquiring section 66 in the same cycle of the reference clock are arranged in time-series in the signal under measurement. In this way, the delaying section 62 can use the first acquiring section 64 and the second acquiring section 66 to acquire the value of the signal under measurement at intervals that are less than one cycle of the reference clock.

If N delayed signals are generated, where N is an integer greater than 1, the delaying section 62 may generate each delayed signal to be delayed relative to each other by a time of $1/(2 \times N)$ cycles of the reference clock. Therefore, when the duty ratio of the reference clock is 50% and (i) the values of the plurality of delayed signals acquired by the first acquiring section 64 at the rising edges and (ii) the values of the plurality of delayed signals acquired by the second acquiring section 66 at the falling edges are arranged in time-series in the signal under measurement, the delaying section 62 can keep the acquisition timing of each value within one cycle of the reference clock.

The change point detecting section 70 reads, for each cycle of the reference clock, the values of the delayed signals acquired by the first acquiring section 64 and the values of the delayed signals acquired by the second acquiring section 66. If the values of the plurality of delayed signals acquired by the first acquiring section 64 and the second acquiring section 66 are arranged in time-series in the signal under measurement, the change point detecting section 70 may then detect that the signal under measurement has changed between the acquisition timings of two values on a condition that these two values are adjacent and different.

For example, the change point detecting section 70 detects (i) a portion at which two adjacent values switch from logic L to logic H or (ii) a portion at which two adjacent values switch from logic H to logic L, and then judges that the signal under measurement changes between the acquisition timings of these two values. For example, the change point detecting section 70 may be set by an external section to detect either the portion at which the adjacent values switch from logic L to logic H or the portion at which the adjacent values switch from logic H to logic L.

In the example of FIG. 3, the change point detecting section 70 detects a change in the value of the signal under measurement between the third acquisition timing, which is logic L, and the fourth acquisition timing, which is logic H, when the values of the delayed signals are arranged in time-series in the signal under measurement. The change point detecting section 70 then calculates the timing of the change point within one cycle of the reference clock based on the acquisition timings of the adjacent values detected as being different. The change point detecting section 70 described above can detect the timing of a point at which the value of the signal under measurement changes with an accuracy more precise than one cycle of the reference clock.

Furthermore, the change point detecting section 70 may detect the timing of a change point of the signal under measurement based on the number of clocks counted by the counting section 68 and the values of the delayed signals acquired by the first acquiring section 64 and the second acquiring section 66. In this way, the change point detecting section 70 can measure a time greater than one cycle of the reference clock.

The detection apparatus 14 described above can detect a timing of a change point of the signal under measurement with an accuracy more precise than one cycle of the reference clock, without using an expensive device such as an AD converter. In other words, the detection apparatus 14 can accurately detect the timing of a change point of a signal under measurement.

The detection apparatus 14 may be further provided with an acquiring section that acquires values of the delayed signals at phases other than the first and second phases of the reference clock. For example, the detection apparatus 14 may further include an acquiring section that acquires a plurality of delayed signals at an intermediate phase that is between the rising edges and the falling edges of the reference clock.

The detection apparatus 14 may generate timings that indicate phases obtained by dividing one cycle of the reference clock into quarters, so as to perform memory data transfer using a QDR (Quad Data Rate) or the like, and acquire a plurality of delayed signals at each of these phases. In this case, the change point detecting section 70 detects the change points of the signal under measurement including the plurality of values acquired at the first phases and the second phases. This detection apparatus 14 can more accurately detect the change points of the signal under measurement. Furthermore, the detection apparatus 14 may be configured as an FPGA (Field Programmable Gate Array) including the first acquiring section 64, the second acquiring section 66, the counting section 68, and the change point detecting section 70.

Figure 4:
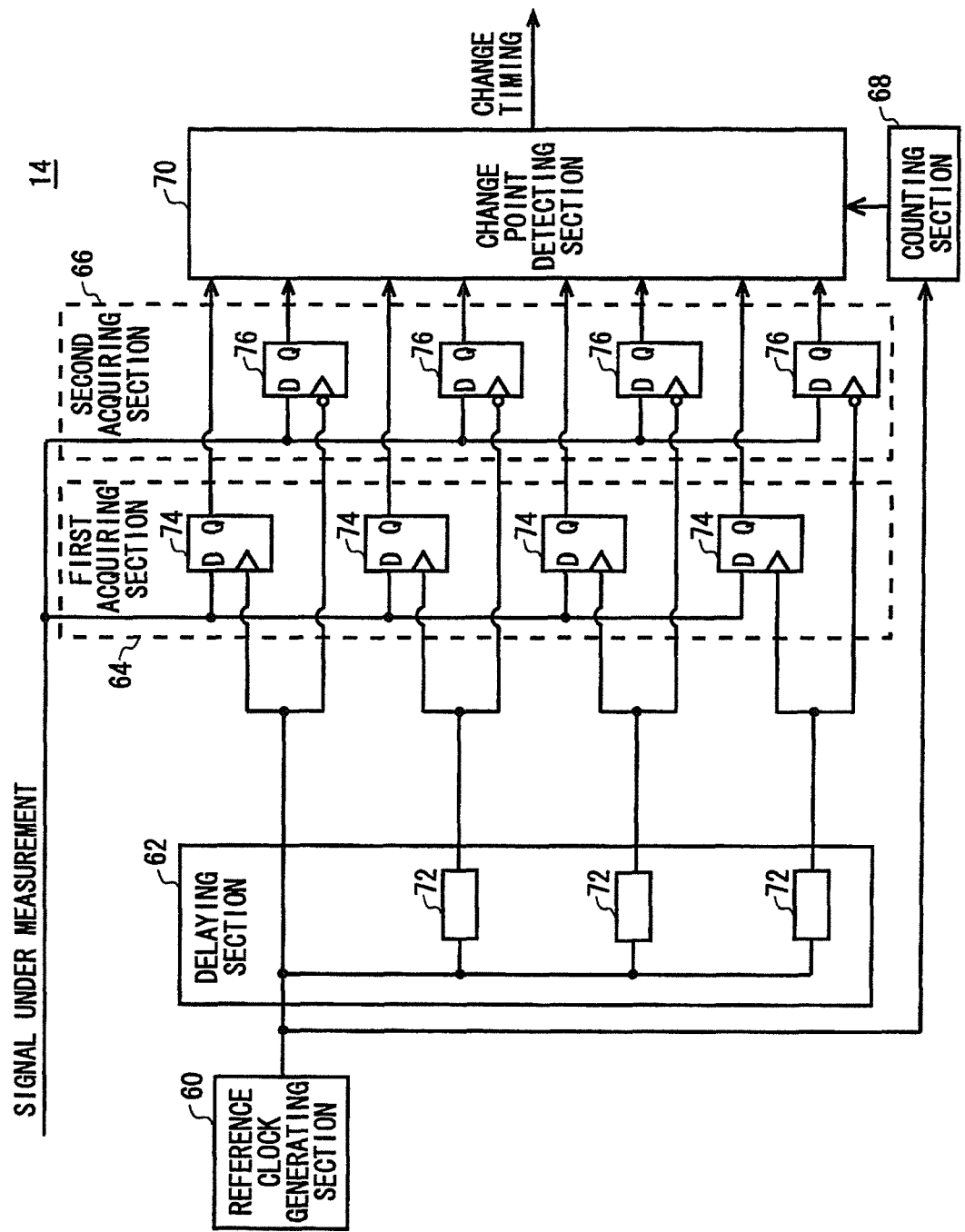
FIG. 4 shows an exemplary configuration of the detection apparatus 14 according to a first modification of the present embodiment.

FIG. 4 shows an exemplary configuration of the detection apparatus 14 according to a first modification of the present embodiment. The detection apparatus 14 of the first modification has the same function and configuration as the detection apparatus 14 described in relation to FIG. 2, and therefore components that are the same as those of the detection apparatus 14 of FIG. 2 are given the same numerals and the following description includes only differing points.

Instead of delaying the signal under measurement, the delaying section 62 generates the plurality of delayed signals by delaying the reference clock generated by the reference clock generating section 60 by differing delay amounts. In the present modification, the delaying section 62 includes a plurality of delay elements 72 that each delay the reference clock by a different set delay amount.

The first acquiring section 64 acquires the value, i.e. the logic value, of the signal under measurement at the first phases of each of the delayed signals. For example, the first acquiring section 64 acquires the value of the signal under measurement at the rising edges of each of the delayed signals. In the present modification, the first acquiring section 64 includes a plurality of first latch sections 74 that correspond one-to-one with the plurality of delayed signals. Each first latch section 74 acquires the value of the signal under measurement at the timings of the rising edges of the corresponding delayed signal.

The second acquiring section 66 acquires the value, i.e. the logic value, of the signal under measurement at the second phases of each of the delayed signals. For example, the second acquiring section 66 acquires the value of the signal under measurement at the falling edges of each of the delayed signals. In the present example, the second acquiring section 66 includes a plurality of second latch sections 76 that correspond one-to-one with the plurality of delayed signals. Each second latch section 76 acquires the value of the signal under measurement at the timings of the falling edges of the corresponding delayed signal. In the same manner as the detection apparatus 14 shown in FIG. 2, the detection apparatus 14 according to the present modification can detect a timing of a change point of the signal under measurement with an accuracy more precise than one cycle of the reference clock, without using an expensive device such as an AD converter.

Figure 5:
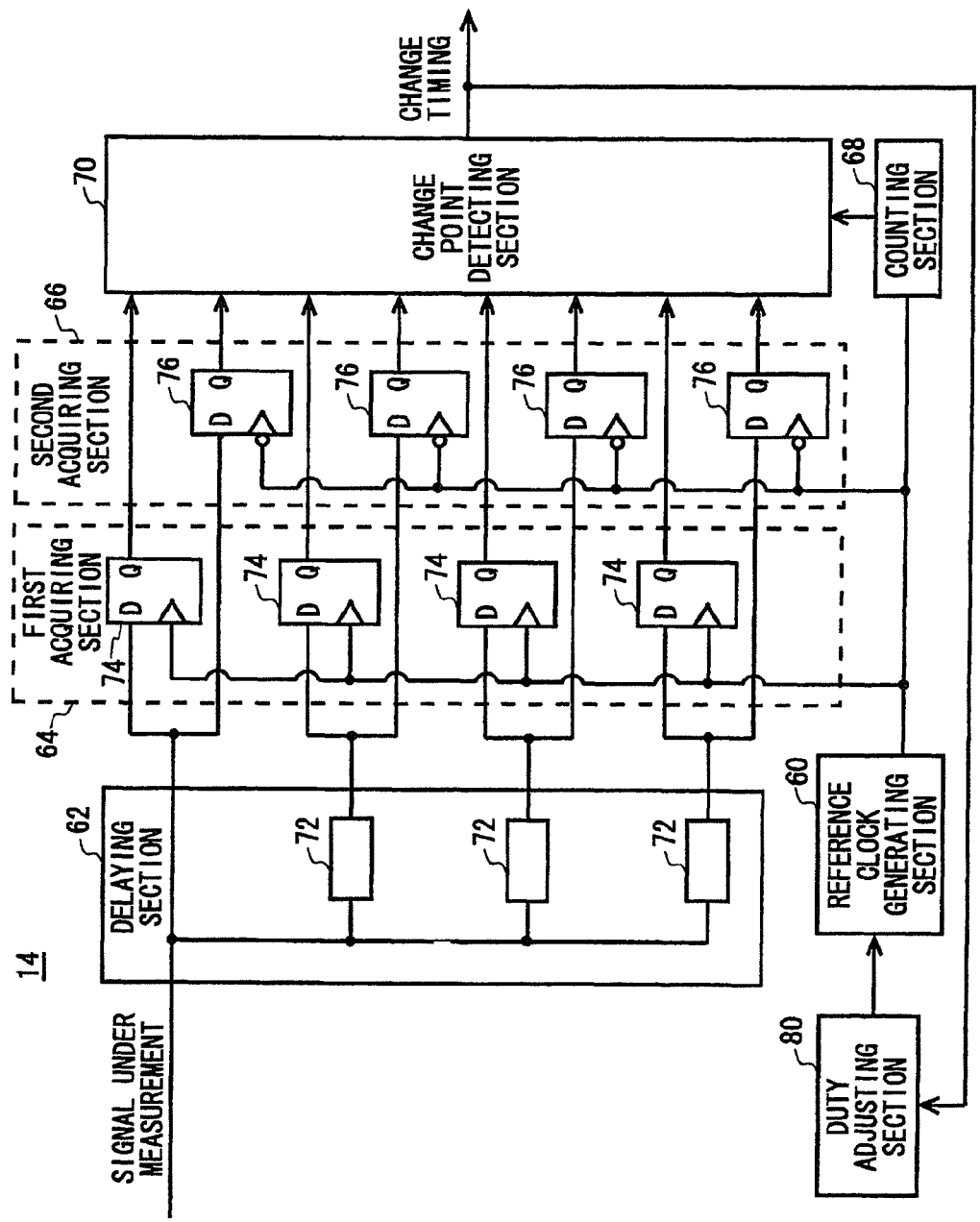
FIG. 5 shows an exemplary configuration of the detection apparatus 14 according to a second modification of the present embodiment.

FIG. 5 shows an exemplary configuration of the detection apparatus 14 according to a second modification of the present embodiment. The detection apparatus 14 of the second modification has the same function and configuration as the detection apparatus 14 described in relation to FIG. 2, and therefore components that are the same as those of the detection apparatus 14 of FIG. 2 are given the same numerals and the following description includes only differing points.

The detection apparatus 14 of the present modification is further provided with a duty ratio adjusting section 80. The duty ratio adjusting section 80 changes the duty ratio of the reference clock generated by the reference clock generating section 60.

Figure 6:
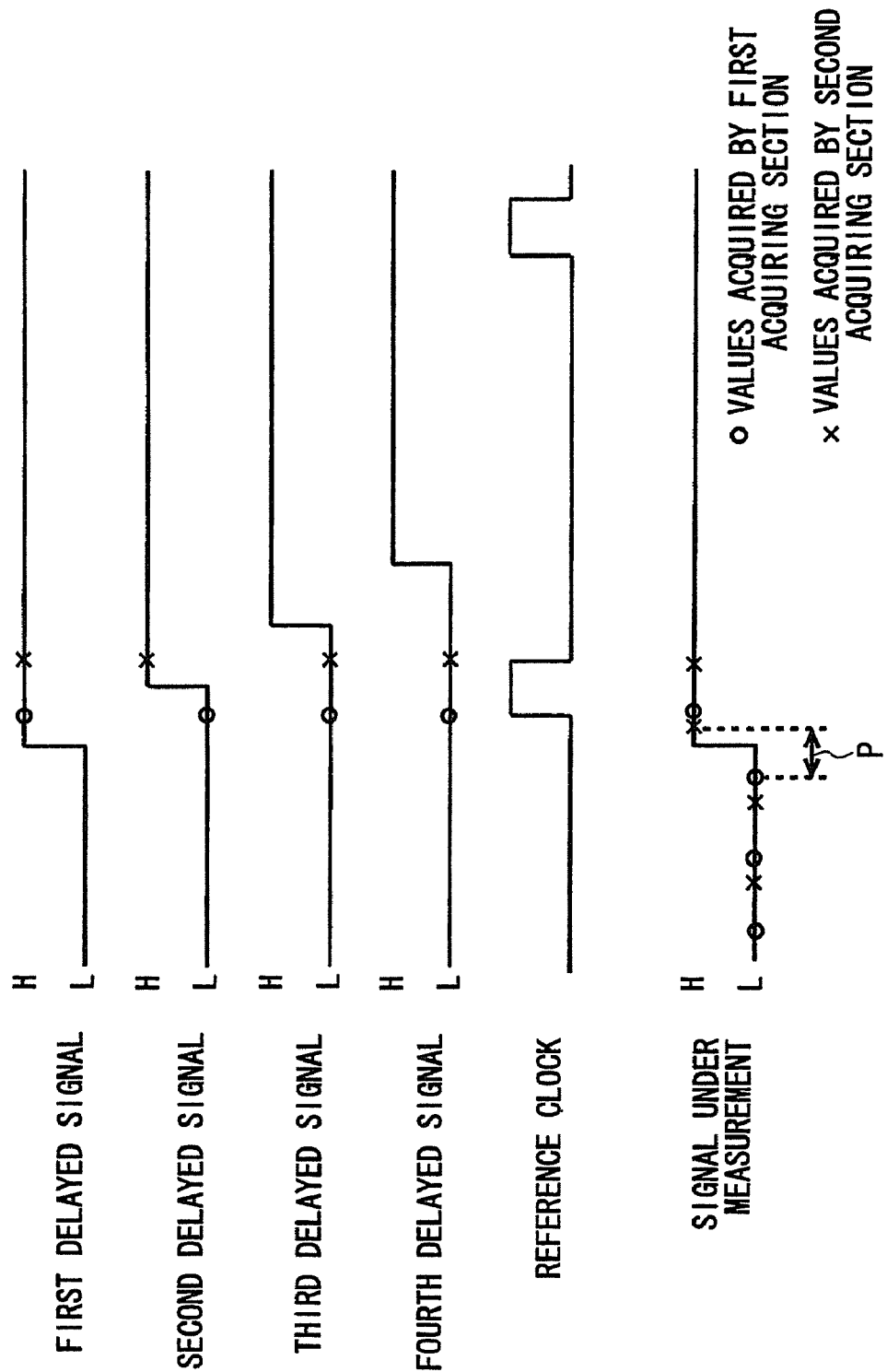
FIG. 6 shows examples of the four delayed signals, the reference clock, and the signal under measurement according to the second modification.

FIG. 6 shows examples of the four delayed signals, the reference clock, and the signal under measurement according to the present modification. The delaying section 62 delays the signal under measurement such that the values of the delayed signals acquired by the first acquiring section 64 and the values of the delayed signals acquired by the second acquiring section 66 are arranged in an alternating manner, when the values of the plurality of delayed signals acquired by the first acquiring section 64 and the second acquiring section 66 in the same cycle of the reference clock are arranged in time-series in the signal under measurement.

For example, the delaying section 62 may set a delay difference between each delayed signal that is greater than the interval from a first phase of the reference clock, i.e. a rising edge, to a second phase of the reference clock, i.e. a falling edge. In this way, the delaying section 62 can line up, in an alternating manner, the timings at which the first acquiring section 64 acquires the values of the delayed signals and the timings at which the second acquiring section 66 acquires the values of the delayed signals.

In response to the change point detecting section 70 detecting that the signal under measurement has changed between the acquisition timings of two adjacent values in a case where the values of the plurality of delayed signals acquired by the first acquiring section 64 and the second acquiring section 66 are arranged in time-series in the signal under measurement, the duty ratio adjusting section 80 adjusts the duty ratio of the reference clock such that the interval P between the acquisition timings of the two adjacent values becomes smaller. For example, the duty ratio adjusting section 80 may adjust the duty ratio of the reference clock by keeping the timing of the first phase of the reference clock, i.e. the rising edge, fixed and changing the timing of the second phase of the reference clock, i.e. the falling edge.

The change point detecting section 70 then detects the change point of the signal under measurement again after the duty ratio adjusting section 80 has adjusted the duty ratio of the reference clock. More specifically, first, the test signal supplying section 12 supplies the device under test 200 with a test signal so that the device under test 200 outputs a response signal, i.e. a signal under measurement. The change point detecting section 70 then detects the change point of the signal under measurement output by the device under test 200 using a clock set to have a prescribed duty ratio.

Next, the duty ratio adjusting section 80 adjusts the duty ratio of the reference clock such that the interval P between acquisition timings of two adjacent values sandwiching the change point becomes smaller. For example, the duty ratio adjusting section 80 may adjust the duty ratio of the reference clock by changing the phase of one of the rising edge or the falling edge of the reference clock. The test signal supplying section 12 then supplies the same test signal to the device under test 200, so that the device under test 200 outputs the same response signal, i.e. signal under measurement.

Next, the change point detecting section 70 again detects the change point of the same signal under measurement output by the device under test 200 using the clock with the adjusted duty ratio. By repeating the above process, the detection apparatus 14 can cause the first or second phase of the reference clock to close in on the timing of the change point of the delayed signal. In this way, the detection apparatus 14 can more accurately measure the timings of the change points of the signal under measurement.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. An apparatus comprising:
   a delaying section that generates a plurality of delayed signals by delaying a signal under measurement by different delay amounts;
   a first acquiring section that acquires each of the plurality of delayed signals at a first phase of a reference clock;
   a second acquiring section that acquires each of the plurality of delayed signals at a second phase of the reference clock, which is different from the first phase; and
   a change point detecting section that detects a change point of the signal under measurement based on values of the plurality of delayed signals acquired at the first phase and values of the plurality of delayed signals acquired at the second phase.

2. The apparatus according to claim 1, wherein
   the first acquiring section acquires each of the plurality of delayed signals at a rising edge of the reference clock, and
   the second acquiring section acquires each of the plurality of delayed signals at a falling edge of the reference clock.

3. The apparatus according to claim 2, wherein
   when the values of the plurality of delayed signals acquired by the first acquiring section and the second acquiring section are arranged in time-series in the signal under measurement, the change point detecting section detects that the signal under measurement has changed between acquisition timings of two adjacent values, on a condition that these two values are different from each other.

4. The apparatus according to claim 3, further comprising a counting section that counts a number of clocks of the reference clock, wherein the change point detecting section detects a timing of the change point of the signal under measurement based on the number of clocks counted by the counting section and the values of the plurality of delayed signals acquired by the first acquiring section and the second acquiring section.

5. The apparatus according to claim 4, wherein
   when the values of the plurality of delayed signals acquired by the first acquiring section and the second acquiring section in a single cycle of the reference clock are arranged in time-series in the signal under measurement, the delaying section delays the signal under measurement such that the acquisition timing of each value is within one period of the reference clock.

6. The apparatus according to claim 5, further comprising a reference clock generating section that generates the reference clock to have a duty ratio of 50%.

7. The apparatus according to claim 5, wherein
   when the values of the plurality of delayed signals acquired by the first acquiring section and the second acquiring section are arranged in time-series in the signal under measurement, the delaying section delays the signal under measurement such that (i) the acquisition timing of the value of the delayed signal acquired by the first acquiring section and (ii) the acquisition timing of the value of the delayed signal acquired by the second acquiring section are lined up in an alternating manner,
   the apparatus further comprises a duty ratio adjusting section that, in response to the change point detecting section detecting that the signal under measurement has changed between the acquisition timings of two adjacent values when the values of the plurality of delayed signals acquired by the first acquiring section and the second acquiring section are arranged in time-series in the signal under measurement, adjusts a duty ratio of the reference clock such that an interval between the acquisition timings of the two adjacent values becomes smaller, and
   the change point detecting section detects the change point of the signal under measurement again after the duty ratio adjusting section has adjusted the duty ratio of the reference clock.

8. An apparatus comprising:
   a delaying section that generates a plurality of delayed signals by delaying a reference clock by different delay amounts;
   a first acquiring section that acquires a signal under measurement at a first phase of each of the plurality of delayed signals;
   a second acquiring section that acquires the signal under measurement at a second phase of each of the plurality of delayed signals, the second phase being different from the first phase; and
   a change point detecting section that detects a change point of the signal under measurement based on a value of the signal under measurement acquired at the first phase of each of the plurality of delayed signals and a value of the signal under measurement acquired at the second phase of each of the plurality of delayed signals.

9. The apparatus according to claim 8, wherein
   the first acquiring section acquires the signal under measurement at a rising edge of each of the plurality of delayed signals, and
   the second acquiring section acquires the signal under measurement at a falling edge of each of the plurality of delayed signals.

10. A method comprising:
generating a plurality of delayed signals by delaying a single under measurement by different delay amounts;
acquiring each of the plurality of delayed signals at a first phase of a reference clock;
acquiring each of the plurality of delayed signals at a second phase of the reference clock, which is different from the first phase; and
detecting a change point of the signal under measurement based on values of the plurality of delayed signals acquired at the first phase and values of the plurality of delayed signals acquired at the second phase.

11. The method according to claim 10, wherein
the first phase of the reference clock is a rising edge of the reference clock, and
the second phase of the reference clock is a falling edge of the reference clock.

12. A method comprising:
generating a plurality of delayed signals by delaying a reference clock by different delay amounts;
acquiring a signal under measurement at a first phase of each of the plurality of delayed signals;
acquiring the signal under measurement at a second phase of each of the plurality of delayed signals, the second phase being different from the first phase; and
detecting a change point of the signal under measurement based on a value of the signal under measurement acquired at the first phase of each of the plurality of delayed signals and a value of the signal under measurement acquired at the second phase of each of the plurality of delayed signals.

13. The method according to claim 12, wherein
the first phase of each of the plurality of delayed signals is a rising edge of the delayed signal, and
the second phase of each of the plurality of delayed signals is a falling edge of the delayed signal.

* * * * *